United States Patent
Suzuki

(10) Patent No.: US 8,102,146 B2
(45) Date of Patent: Jan. 24, 2012

(54) REMAINING-AMOUNT ESTIMATION DEVICE AND METHOD FOR SECONDARY BATTERY

(75) Inventor: Yusuke Suzuki, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 859 days.

(21) Appl. No.: 12/087,925

(22) PCT Filed: Feb. 7, 2007

(86) PCT No.: PCT/JP2007/052550
§ 371 (c)(1),
(2), (4) Date: Jul. 17, 2008

(87) PCT Pub. No.: WO2007/091722
PCT Pub. Date: Aug. 16, 2007

(65) Prior Publication Data
US 2009/0024338 A1 Jan. 22, 2009

(30) Foreign Application Priority Data
Feb. 9, 2006 (JP) .................................. 2006-032679

(51) Int. Cl.
*H01M 10/44* (2006.01)
*H02J 7/00* (2006.01)
*G01R 31/36* (2006.01)

(52) U.S. Cl. ............ 320/107; 320/132; 320/134; 702/63

(58) Field of Classification Search ................ 320/107, 320/132, 134; 702/63
See application file for complete search history.

(56) References Cited

U.S. PATENT DOCUMENTS

| 5,691,078 | A | 11/1997 | Kozaki et al. |
| 6,495,989 | B1 | 12/2002 | Eguchi |
| 7,078,907 | B2 * | 7/2006 | Uesaka et al. ................ 324/429 |
| 7,986,128 | B2 * | 7/2011 | Kubota et al. ................ 320/124 |
| 2002/0167203 | A1 | 11/2002 | Rieger et al. |
| 2003/0097225 | A1 | 5/2003 | Teruo |
| 2005/0024020 | A1 | 2/2005 | Hogari et al. |
| 2007/0145949 | A1 * | 6/2007 | Matsushima et al. ......... 320/132 |
| 2007/0170892 | A1 * | 7/2007 | Ishii ............................. 320/132 |
| 2010/0318252 | A1 * | 12/2010 | Izumi ............................. 701/22 |

FOREIGN PATENT DOCUMENTS

| JP | A-09-171065 | 6/1997 |
| JP | A-2000-258514 | 9/2000 |
| JP | A-2001-057246 | 2/2001 |
| JP | A-2002-369391 | 12/2002 |

(Continued)

*Primary Examiner* — Jay Patidar
(74) *Attorney, Agent, or Firm* — Oliff & Berridge, PLC

(57) ABSTRACT

An SOC-estimation-value-depending gain selection unit multiplies the deviation of an SOC estimation value (last calculated value) relative to an estimated SOC by a correction gain G1 to calculate a correction value. The SOC-estimation-value-depending gain selection unit selects a relatively small correction gain G1 when the SOC estimation value lies in the range in proximity to excessive charging and the SOC estimation value is corrected to a smaller value (toward the SOC control center), and when the SOC estimation value lies in the range in proximity to excessive discharging and the SOC estimation value is corrected to a larger value (toward the SOC control center). Thus, the correction is performed so as to indicate the safe side value for the secondary battery in charge/discharge control when the SOC estimation value is in proximity to excessive charging or excessive discharging.

18 Claims, 9 Drawing Sheets

FOREIGN PATENT DOCUMENTS

| | | |
|---|---|---|
| JP | A-2003-068370 | 3/2003 |
| JP | A-2003-149307 | 5/2003 |
| JP | A-2005-049216 | 2/2005 |
| WO | WO 99/61929 A1 | 12/1999 |

* cited by examiner

FIG.4
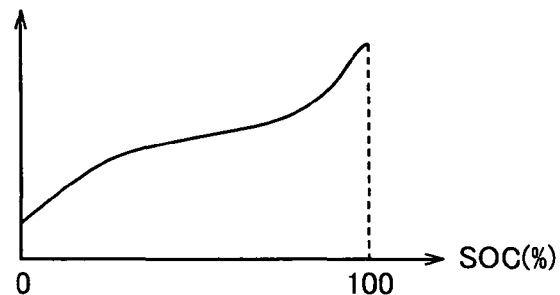
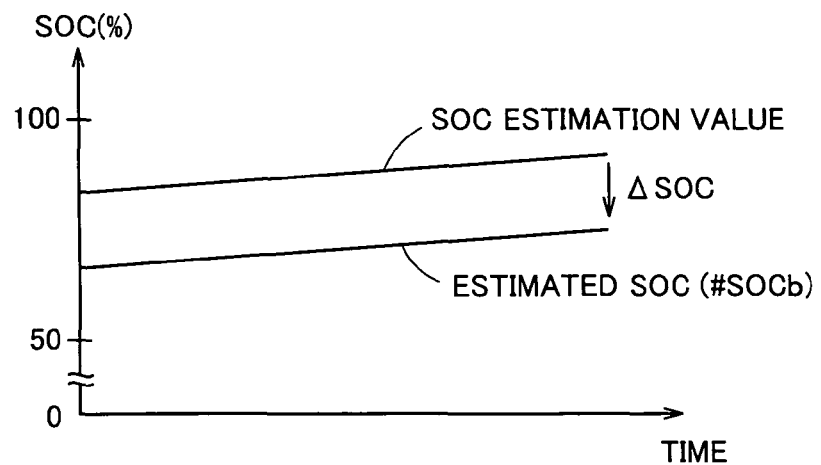
FIG.5A
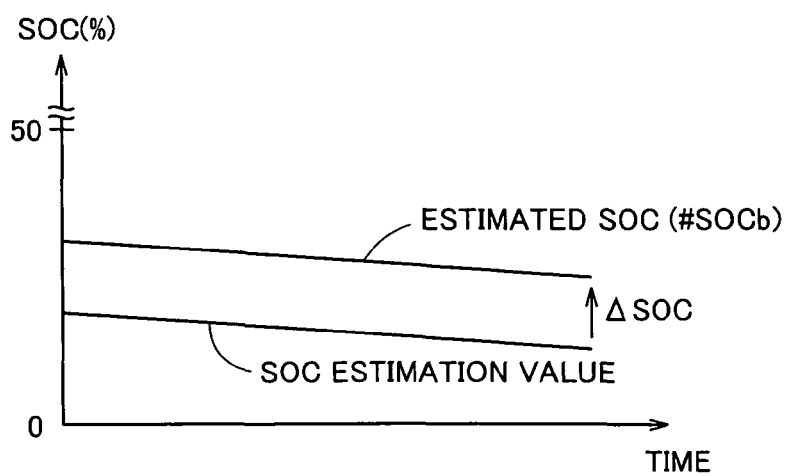
FIG.5B

REMAINING-AMOUNT ESTIMATION DEVICE AND METHOD FOR SECONDARY BATTERY

TECHNICAL FIELD

The present invention relates to a device and method for estimating a remaining amount of a chargeable secondary battery, and particularly to a technique for avoiding excessive charging and excessive discharging of the secondary battery with more stability.

BACKGROUND ART

The secondary battery, which is used in various fields, requires the appropriate charge/discharge control for the efficient operation thereof. This requires the remaining amount of the secondary battery (State of Charge; hereinafter simply referred to as an SOC) to be estimated with high accuracy.

Conventionally, a so-called current integration scheme is known, in which the input/output current of the secondary battery is integrated to estimate the SOC. In this current integration scheme, for example, in the case where the battery is not fully charged, the improvement in the estimation accuracy is limited due to the reasons including the effects of the error resulting from cancellation of the least significant bit in the processing device (CPU) performing the current integration, capacity decrease caused by self-discharge, and the like, or high dependence on the current sensor accuracy.

Thus, in order to improve the estimation accuracy, it is proposed that both of the electromotive voltage (Open Circuit Voltage; hereinafter simply referred to as an OCV) of the battery and the current integrated value are used to estimate the remaining amount of the battery (SOC) (for example, Japanese Patent Laying-Open No. 2003-149307). Specifically, the remaining-amount calculation method for the battery is proposed which is characterized in that an SOC correction parameter is determined by the electromotive voltage of the battery and the correction parameter is used to correct the SOC based on the current integration.

Similarly, as an approach for calculating the remaining amount using both of the current integration and the output voltage of the secondary battery, the remaining-amount control method is proposed for correcting, depending on the output voltage, a charge efficiency η used for the remaining-amount estimation based on the current integration (for example, Japanese Patent Laying-Open No. 2002-369391).

In particular, the secondary battery mounted in a hybrid vehicle and the like is subjected to charge/discharge control, based on the estimated SOC, so as to give a higher priority to charging or discharging assuming a control center value of the SOC as a boundary. Furthermore, upper and lower limit values are set in the SOC management range including the control center value to prevent excessive charging and excessive discharging. In other words, while charging is limited or inhibited in the case of exceeding the management upper limit value, discharging is limited or inhibited in the case of falling below the management lower limit value.

Therefore, in view of ensuring the safety in the charge/discharge control of the secondary battery, that is, avoiding excessive charging and excessive discharging of the secondary battery, it is desirable to estimate an SOC estimation value in the vicinity of the upper and lower limit values in the SOC management range with a higher degree of accuracy. Thus, the SOC correction parameter is set to be larger in the vicinity of the upper and lower limit values in the SOC management range.

However, the correction value is determined such that the estimated SOC, based on the integrated value of the charging/discharging current, approaches the estimated SOC based on the electromotive voltage. Consequently, even if the estimated SOC based on the current integrated value (for example, 85%) approaches the management upper limit value (for example, 90%) as compared to the estimated SOC based on the electromotive voltage (for example, 80%), the estimated SOC based on the current integrated value is largely corrected further downward, that is, to be away from the management upper limit value. In view of avoiding the excessive charging of the secondary battery, the above-described correction produces the opposite effect, which increases the possibility of excessive charging on the contrary.

Similarly, even if the estimated SOC based on the current integrated value (for example, 15%) is in close proximity to the management lower limit value (for example, 10%) as compare to the estimated SOC based on the electromotive voltage (for example, 20%), the estimated SOC based on the current integrated value is largely corrected further upward, that is, to be away from the management lower limit value, which increases the possibility of excessive discharging on the contrary.

Furthermore, the time change rate of the remaining amount of the secondary battery varies depending on the magnitude of the charging/discharging current of the secondary battery. Accordingly, in the case where the remaining amount is in proximity to the management upper limit value, the generation of large charging current may cause excessive charging. In the case where the remaining amount is in proximity to the management lower limit value, the generation of large discharging current may cause excessive discharging.

DISCLOSURE OF THE INVENTION

The present invention is made to solve the above-described problems. An object of the present invention is to provide a remaining-amount estimation device and method for the secondary battery for estimating the remaining amount of the secondary battery with high accuracy while avoiding excessive charging and excessive discharging with more stability.

According to an aspect of the present invention, a remaining-amount estimation device for a chargeable secondary battery is provided. The remaining-amount estimation device for the secondary battery includes a first estimation unit calculating a first estimation value for a remaining amount of the secondary battery based on a charging/discharging amount of the secondary battery from a time of a last remaining-amount estimation; a second estimation unit calculating a second estimation value for the remaining amount of the secondary battery based on a state value of the secondary battery; and a correction unit correcting the first estimation value based on a correction value in accordance with a deviation of a last calculated value of the remaining amount from the second estimation value, the last calculated value of the remaining amount being a remaining-amount estimation value of the secondary battery estimated at the time of the last remaining-amount estimation, and generating the remaining-amount estimation value of the secondary battery. The correction unit calculates the correction value based on the magnitude of the last calculated value of the remaining amount and the magnitude relationship between the last calculated value of the remaining amount and the second estimation value.

According to this aspect, in order to generate the remaining-amount estimation value of the secondary battery, the first estimation value calculated based on the charging/discharging amount of the secondary battery from the time of the last remaining-amount estimation is corrected based on the magnitude of the last calculated value of the remaining amount which is the remaining-amount estimation value of the secondary battery estimated at the time of the last remaining-amount estimation and the magnitude relationship between the last calculated value of the remaining amount and the second estimation value, to thereby calculate the remaining-amount estimation value of the secondary battery. Consequently, the correction value can be determined based on the range in which the last calculated remaining-amount estimation value of the secondary battery lies (for example, whether or not it is in proximity to excessive charging or excessive discharging), and the direction in which the correction value is generated (for example, in which direction of the excessive charging side or the excessive discharging side the correction value is generated).

Therefore, in the case of being in the range in proximity to excessive charging or excessive discharging, the remaining-amount estimation value can be calculated so as to indicate the safe side (further excessive charging side or further excessive discharging side) value for the secondary battery in the charge/discharge control. In the range other than the above-mentioned range, it is possible to enhance the followability to the second estimation value to improve the estimation accuracy of the remaining-amount estimation value.

Preferably, the correction unit includes a deviation calculation unit calculating the deviation receiving the second estimation value and the last calculated value of the remaining amount; a correction value calculation unit calculating the correction value by multiplying the deviation received from the deviation calculation unit by at least one correction gain; and an estimation value calculation unit adding the correction value received from the correction value calculation unit to the first estimation value received from the first estimation unit, for output. The at least one correction gain includes a first correction gain, and the correction value calculation unit includes a first correction gain selection unit selecting the first correction gain based on the magnitude of the last calculated value of the remaining amount and the magnitude relationship between the last calculated value of the remaining amount and the second estimation value.

Further preferably, the first correction gain selection unit, on the condition that the last calculated value of the remaining amount is within a first range in proximity to excessive charging of the secondary battery and the second estimation value is not less than a first predetermined value, decreases the first correction gain in the case where the last calculated value of the remaining amount is greater than the second estimation value as compared to the case where the last calculated value of the remaining amount is smaller than the second estimation value; and, on the condition that the last calculated value of the remaining amount is within a second range in proximity to excessive discharging of the secondary battery and the second estimation value is not more than a second predetermined value, decreases the first correction gain in the case where the last calculated value of the remaining amount is smaller than the second estimation value as compared to the case where the last calculated value of the remaining amount is greater than the second estimation value.

Preferably, the first correction gain selection unit selects the first correction gain by referring to a predetermined map in which the last calculated value of the remaining amount and the second estimation value each are defined as an input.

Preferably, the at least one correction gain further includes a second correction gain, and the correction value calculation unit further includes a second correction gain selection unit selecting the second correction gain based on the relationship between an input/output current of the secondary battery for charging/discharging the secondary battery and the second estimation value.

Further preferably, the second correction gain selection unit, in the case where the second estimation value is not less than a third predetermined value in proximity to excessive charging of the secondary battery, increases the second correction gain as the input current to the secondary battery increases; and, in the case where the second estimation value is not more than a fourth predetermined value in proximity to excessive discharging of the secondary battery, increases the second correction gain as the output current to the secondary battery increases.

More preferably, the second correction gain selection unit selects the second correction gain by referring to the predetermined map in which the input/output current of the secondary battery and the second estimation value each are defined as an input.

According to another aspect of the present invention, a remaining-amount estimation device for a chargeable secondary battery is provided. The remaining-amount estimation device for the secondary battery includes a first estimation unit calculating a first estimation value for a remaining amount of the secondary battery based on a charging/discharging amount of the secondary battery from a time of a last remaining-amount estimation; a second estimation unit calculating a second estimation value for the remaining amount of the secondary battery based on a state value of the secondary battery; and a correction unit correcting the first estimation value based on a correction value in accordance with a deviation of a last calculated value of the remaining amount from the second estimation value, the last calculated value of the remaining amount being a remaining-amount estimation value of the secondary battery estimated at the time of the last remaining-amount estimation, and generating the remaining-amount estimation value of the secondary battery. The correction unit calculates the correction value based on the relationship between an input/output current of the secondary battery for charging and discharging the secondary battery and the second estimation value.

According to this aspect, in order to generate the remaining-amount estimation value of the secondary battery, the first estimation value calculated based on the charging/discharging amount of the secondary battery from the time of the last remaining-amount estimation is corrected based on the relationship between the input/output current of the secondary battery and the second estimation value, to thereby calculate the remaining-amount estimation value of the secondary battery. Thus, the correction value can be determined based on the input/output current of the secondary battery corresponding to the range in which the second estimation value lies (for example, whether the input current which is not less than a predetermined value is generated in the range in proximity to excessive charging, or whether the output current which is not less than the predetermined value is generated in the range in proximity to excessive discharging).

Consequently, in the case where the second estimation value is in the range in proximity to excessive charging and the input current to the secondary battery is large, and, in the case where the second estimation value is in the range in proximity to excessive discharging and the output current from the secondary battery is large, it is possible to enhance the followability to the second estimation value to improve the estimation accuracy of the remaining-amount estimation value.

Preferably, the correction unit includes a deviation calculation unit calculating the deviation receiving the second estimation value and the last calculated value of the remaining amount; a correction value calculation unit calculating the correction value by multiplying the deviation received from the deviation calculation unit by at least one correction gain; and an estimation value calculation unit adding the correction value received from the correction value calculation unit to the first estimation value received from the first estimation unit, for output. The at least one correction gain includes a first correction gain, and the correction value calculation unit includes a first correction gain selection unit selecting the first correction gain based on the relationship between the input/output current of the secondary battery and the second estimation value.

Further preferably, the first correction gain selection unit, in the case where the second estimation value is not less than a first predetermined value in proximity to excessive charging of the secondary battery, increases the first correction gain as the input current to the secondary battery increases; and, in the case where the second estimation value is not more than a second predetermined value in proximity to excessive discharging of the secondary battery, increases the first correction gain as the output current from the secondary battery increases.

Further preferably, the first correction gain selection unit selects the first correction gain by referring to a predetermined map in which the input/output current of the secondary battery and the second estimation value each are defined as an input.

Further preferably, the at least one correction gain further includes a third correction gain, and the correction value calculation unit further includes a third correction gain selection unit selecting the third correction gain based on a battery temperature of the secondary battery.

Further preferably, the third correction gain selection unit increases the third correction gain as the battery temperature of the secondary battery increases.

Further preferably, the first estimation unit obtains the charging/discharging amount of the secondary battery based on an integrated value of the input/output current of the secondary battery.

Further preferably, the second estimation unit calculates the second estimation value based on an electromotive voltage of the secondary battery.

Further preferably, the remaining-amount estimation device for the secondary battery further includes an electromotive voltage calculation unit calculating the electromotive voltage of the secondary battery based on a charge/discharge voltage of the secondary battery, a polarized voltage of the secondary battery, and a voltage drop caused by an internal resistance of the secondary battery.

According to another aspect of the present invention, a remaining-amount estimation method for a chargeable secondary battery includes the steps of calculating a first estimation value for a remaining amount of the secondary battery based on a charging/discharging amount of the secondary battery from a time of a last remaining-amount estimation; calculating a second estimation value for the remaining amount of the secondary battery based on a state value of the secondary battery; and correcting the first estimation value based on a correction value in accordance with a deviation of a last calculated value of the remaining amount from the second estimation value, the last calculated value of the remaining amount being a remaining-amount estimation value of the secondary battery estimated at the time of the last remaining-amount estimation, and generating the remaining-amount estimation value of the secondary battery. In the generation of the remaining-amount estimation value of the secondary battery, the correction value is calculated based on the magnitude of the last calculated value of the remaining amount and the magnitude relationship between the last calculated value of the remaining amount and the second estimation value.

According to still another aspect of the present invention, a remaining-amount estimation method for a chargeable secondary battery is provided. The remaining-amount estimation method for the secondary battery includes the steps of calculating a first estimation value for a remaining amount of the secondary battery based on a charging/discharging amount of the secondary battery from a time of a last remaining-amount estimation; calculating a second estimation value for the remaining amount of the secondary battery based on a state value of the secondary battery; and correcting the first estimation value based on a correction value in accordance with a deviation of a last calculated value of the remaining amount from the second estimation value, the last calculated value of the remaining amount being a remaining-amount estimation value of the secondary battery estimated at the time of the last remaining-amount estimation, and generating the remaining-amount estimation value of the secondary battery. In the generation of the remaining-amount estimation value of the secondary battery, the correction value is calculated based on the relationship between an input/output current of the secondary battery for charging and discharging the secondary battery and the second estimation value.

According to the present invention, a remaining-amount estimation device and method for the secondary battery can be achieved for estimating the remaining amount of the secondary battery with high accuracy while avoiding excessive charging and excessive discharging with more stability.

BRIEF DESCRIPTION OF THE DRAWINGS

FIG. 4 shows an example of the relationship between an electromotive voltage of the secondary battery and an SOC.

FIGS. 5A and 5B are diagrams for describing a correction value calculated in an SOC calculation unit.

BEST MODES FOR CARRYING OUT THE INVENTION

Figure 1:
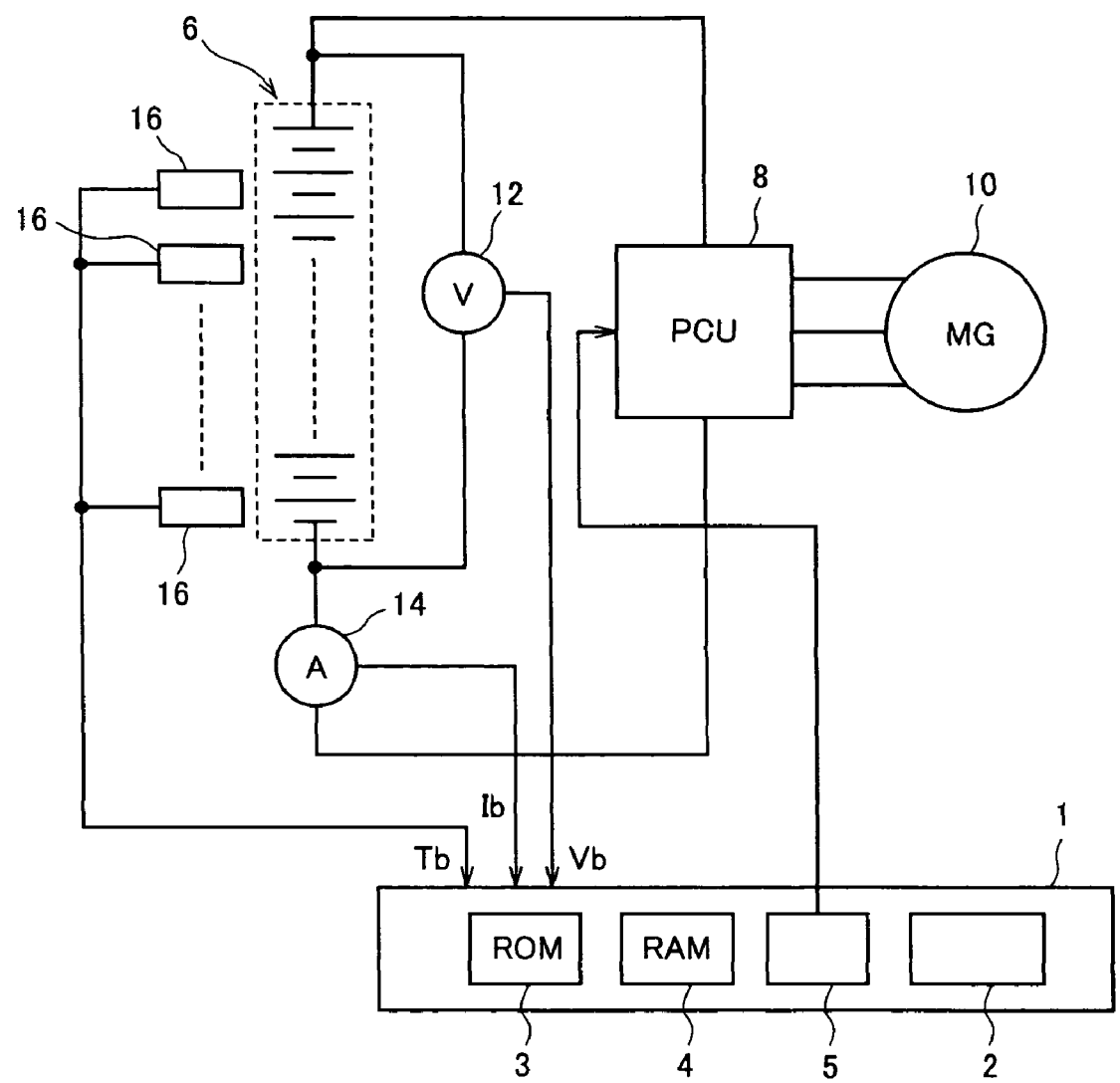
FIG. 1 is a schematic configuration diagram of a vehicle incorporating a remaining-amount estimation device for a secondary battery according to a first embodiment of the present invention.

The embodiments of the present invention will be hereinafter described in detail with reference to the accompanying drawings, in which the same or corresponding components are designated by the same reference characters, and description thereof will not be repeated.

First Embodiment

Referring to FIG. 1, a vehicle 100 includes a secondary battery 6, a PCU (Power Control Unit) 8, a motor generator (MG) 10, an ECU 1, a voltage measurement unit 12, a current measurement unit 14, and a temperature measurement unit 16. Vehicle 100 is a hybrid vehicle which runs by at least one of the driving force from motor generator 10 and the driving force from the engine which is not shown. Instead of a hybrid vehicle, the vehicle may be a fuel vehicle incorporating a fuel cell or an electric vehicle which runs only using the driving force from the motor generator.

Secondary battery 6 is a battery set having a configuration in which a plurality of battery modules each consisting of a plurality of integrated battery cells are connected in series and, by way of example, includes a lithium ion battery, a nickel metal hydride battery, and the like. Secondary battery 6 is configured to be charged and discharged by means of PCU 8.

PCU 8 converts DC (Direct Current) power supplied from secondary battery 6 to AC (Alternating Current) power to supply it to motor generator 10 during the power running of vehicle 100, and converts AC power generated by motor generator 10 to DC power to supply it to secondary battery 6 during the regenerative braking of vehicle 100, to thereby collect kinetic energy of vehicle 100 as electric energy. Furthermore, PCU 8 may include a step-up/down converter (DC/DC converter) for boosting DC power supplied from secondary battery 6 and lowering DC voltage supplied from motor generator 10.

It is to be noted that the regenerative braking described herein includes a braking operation involving dynamic braking in the case of the foot brake operation by the driver of the hybrid vehicle and decelerating (or discontinuation of acceleration) while performing dynamic braking by releasing the accelerator pedal during vehicle running without a foot brake operation.

Motor generator 10 which is, for example, a three phase AC rotating electrical machine acts as an electric motor on receiving AC power supplied from PCU 8 and transmits the driving force for driving vehicle 100 to wheels which are not shown. Furthermore, motor generator 10 acts as an electric generator on receiving the rotational driving force transmitted through the wheels and converts the kinetic energy of vehicle 100 to electric power for transferring back to secondary battery 6 by means of PCU 8.

ECU 1 performs processing based on the driving state of vehicle 100, the accelerator pedal position, the shift position, the SOC of the secondary battery, the map and program stored in a ROM (Read Only Memory) 3 incorporated in ECU 1, and the like. Thus, ECU 1 controls the devices incorporated in the vehicle so as to cause a driving state according to the operation instruction from the driver.

Voltage measurement unit 12 measuring a charge/discharge voltage Vb of secondary battery 6, current measurement unit 14 measuring an input/output current Ib of secondary battery 6, and temperature measurement unit 16 measuring a battery temperature Tb of the secondary battery are connected to ECU 1. ECU 1 includes an SOC estimation unit 2 and a charge/discharge control unit 5.

SOC estimation unit 2 sequentially estimates the SOC of secondary battery 6 based on charge/discharge voltage Vb of secondary battery 6, input/output current Ib of secondary battery 6 and battery temperature Tb of secondary battery 6 which are measured by voltage measurement unit 12, current measurement unit 14 and temperature measurement unit 16, respectively. The estimated SOC estimation value of secondary battery 6 is stored in a RAM (Random Access Memory) 4 incorporated in ECU 1.

Depending on the SOC estimation value stored in RAM 4, charge/discharge control unit 5 supplies a control instruction to PCU 8 to control the charging amount supplied from motor generator 10 to secondary battery 6 and the discharging amount supplied from secondary battery 6 to motor generator 10.

Figure 2:
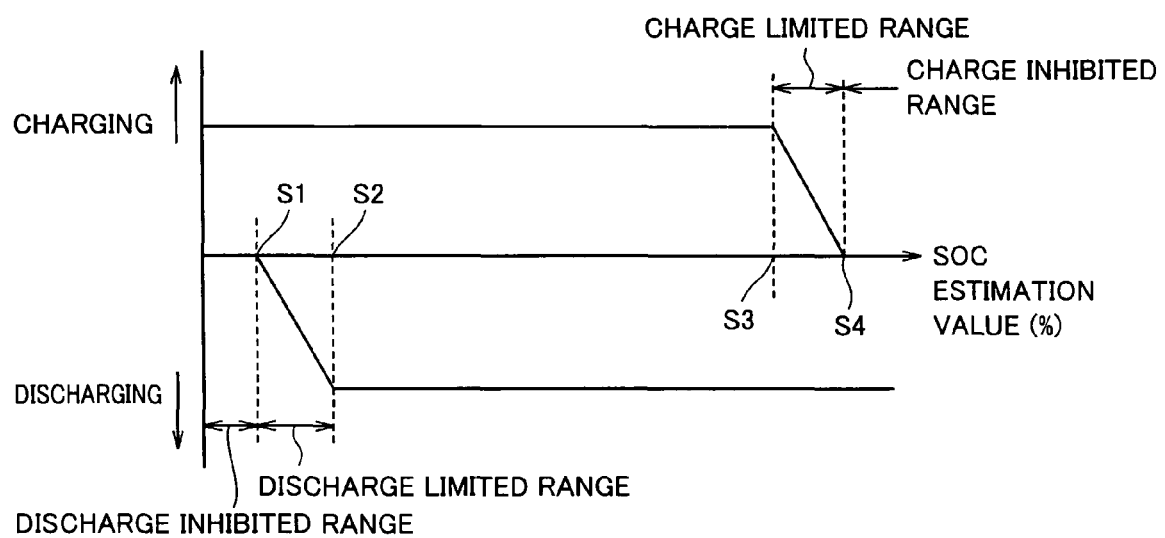
FIG. 2 shows an example of charge/discharge control by a charge/discharge control unit.

FIG. 2 shows an example of charge/discharge control by charge/discharge control unit 5. In FIG. 2, it is assumed that S1<S2<S3<S4.

Referring to FIG. 2, when secondary battery 6 approaches an excessive charging state and the SOC estimation value exceeds a state value S3, charge/discharge control unit 5 decreases the charging amount for secondary battery 6 as the SOC estimation value increases. Furthermore, when the SOC estimation value exceeds a state value S4, charge/discharge control unit 5 sets the charging amount to zero. Thus, charge/discharge control unit 5 limits the charging of secondary battery 6 within a charge limited range (state values S3-S4) and inhibits the charging of secondary battery 6 within a charge inhibited range (state value S4-).

On the other hand, when secondary battery 6 approaches an excessive discharging state and the SOC estimation value falls below a state value S2, charge/discharge control unit 5 decreases the discharging amount for secondary battery 6 as the SOC estimation value decreases. Furthermore, when the SOC estimation value falls below a state value S1, charge/discharge control unit 5 sets the discharging amount to zero. Thus, charge/discharge control unit 5 limits the discharging of secondary battery 6 within a discharge limited range (state values S2-S1) and inhibits the discharging of secondary battery 6 within a discharge inhibited range (state value S1-).

Figure 3:
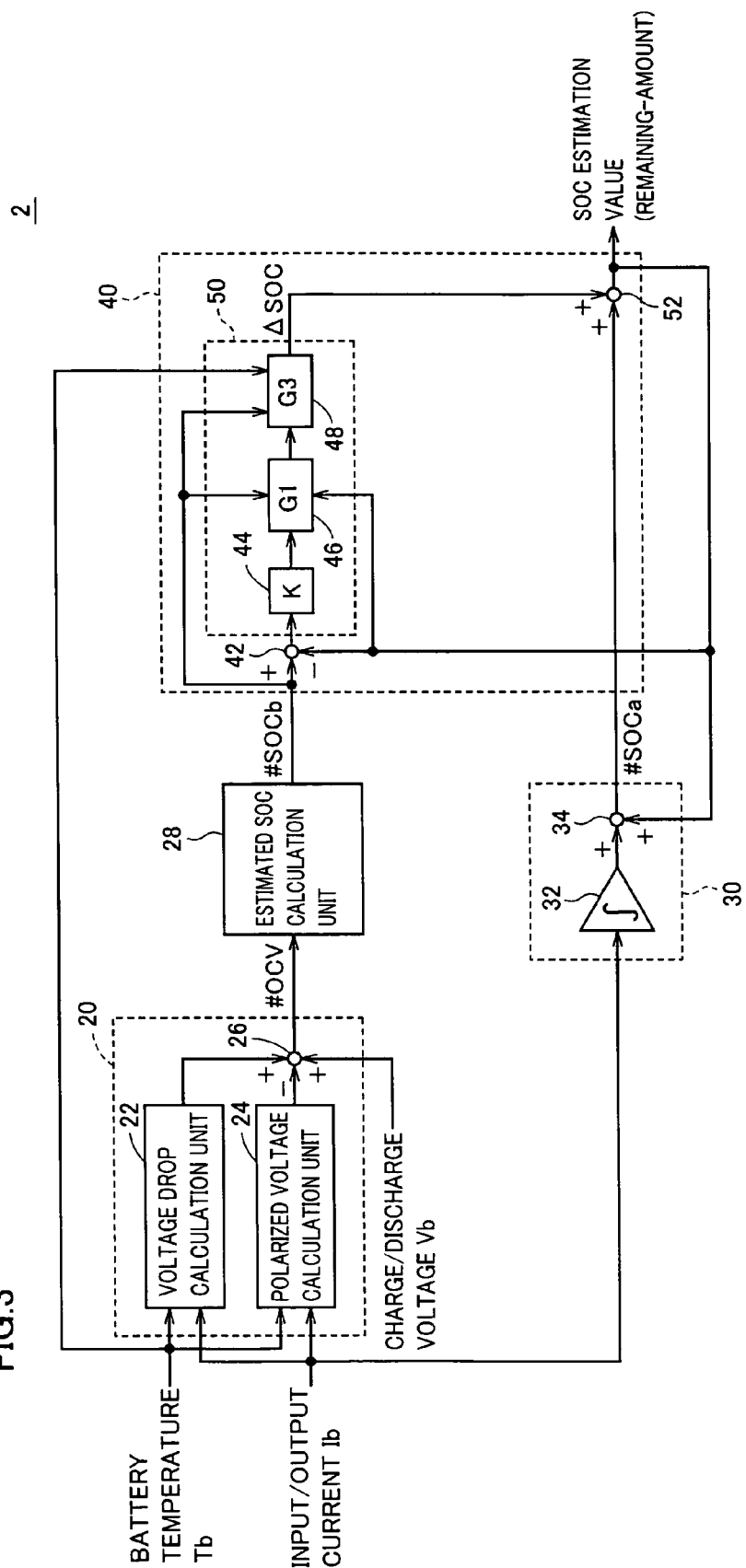
FIG. 3 is a block diagram showing a process in an SOC estimation unit.

Referring to FIG. 3, SOC estimation unit 2 performs processing in a constant cycle (for example, every 100 msec), to calculate the present SOC estimation value based on the SOC estimation value calculated in the previous estimation (one cycle before), charge/discharge voltage Vb, input/output current Ib, and battery temperature Tb. SOC estimation unit 2 includes a provisional SOC calculation unit 30, an electromotive voltage calculation unit 20, an estimated SOC calculation unit 28, and an SOC calculation unit 40.

Provisional SOC calculation unit 30 calculates a first estimation value #SOCa for the remaining amount of secondary battery 6 based on the charging/discharging amount of secondary battery 6 from after the last remaining-amount (SOC) estimation is performed. In other words, provisional SOC calculation unit 30 adds or subtracts the variation amount in the charging/discharging amount in secondary battery 6 in the period from the previous estimation to the present, to thereby calculate first estimation value #SOCa. By way of example, provisional SOC calculation unit 30 obtains the charging/discharging amount of secondary battery 6 based on the integrated value of input/output current Ib of secondary battery 6.

Provisional SOC calculation unit 30 includes an integrating unit 32 integrating input/output current Ib and an adding unit 34 outputting, as first estimation value #SOCa, the sum of an output value of integrating unit 32 and the last calculated SOC estimation value. First estimation value #SOCa is also referred to as a "provisional SOC" hereinafter. The provisional SOC is an estimation value for the remaining amount of secondary battery 6 based on the charging/discharging amount of secondary battery 6 on the basis of the last calculated remaining-amount estimation value.

Electromotive voltage calculation unit 20 calculates the electromotive voltage of secondary battery 6 based on charge/discharge voltage Vb of secondary battery 6, the polarized voltage in secondary battery 6 and the voltage drop caused by the internal resistance of secondary battery 6. Electromotive voltage calculation unit 20 includes a voltage drop calculation unit 22, a polarized voltage calculation unit 24 and an adding unit 26.

Based on battery temperature Tb and input/output current Ib, voltage drop calculation unit 22 calculates a voltage drop occurring in secondary battery 6. For example, variation of the internal resistance is previously stored as a map in which battery temperature Tb is defined as an input (parameter), and this voltage drop is calculated based on the product of the internal resistance obtained by referring to the map and input/output current Ib.

Polarized voltage calculation unit 24 calculates the polarized voltage generated in secondary battery 6 based on battery temperature Tb and input/output current Ib. This polarized voltage may also be calculated by referring to the previously stored map in which battery temperature Tb and input/output current Ib each are defined as an input (parameter).

It is to be noted that the methods for calculating a voltage drop and a polarized voltage are not particularly limited and the well-known technique is applicable thereto, and therefore, detailed description thereof will not be given.

Adding unit 26 adds the voltage drop calculated by voltage drop calculation unit 22 to charge/discharge voltage Vb and subtracts the polarized voltage calculated by polarized voltage calculation unit 24 to thereby calculate an estimation value of the electromotive voltage (open circuit voltage) #OCV of secondary battery 6.

It is to be noted that charge/discharge voltage Vb, input/output current Ib, and battery temperature Tb used in electromotive voltage calculation unit 20 each may be, for example, an average value during the period from the last estimation to the present.

Estimated SOC calculation unit 28 calculates a second estimation value #SOCb for the remaining amount of secondary battery 6 based on electromotive voltage #OCV, which is an example of the state value of secondary battery 6, calculated by electromotive voltage calculation unit 20. Second estimation value #SOCb is also referred to as an "estimated SOC" hereinafter. The estimated SOC is an estimation value for the remaining amount of secondary battery 6 based on the state value of secondary battery 6.

In the first embodiment of the present invention, as an example of calculating the estimation value for the remaining amount based on the state value of secondary battery 6, the configuration (estimated SOC calculation unit 28) in which the estimation value is calculated based on the electromotive voltage of secondary battery 6 is illustrated, but the calculation of the estimated SOC is not limited thereto. For example, the estimated SOC may be calculated based on the battery internal pressure of secondary battery 6. In other words, the estimated SOC can be obtained selectively using the state value such as charge/discharge voltage, input/output current, battery temperature, and battery internal pressure of the secondary battery as appropriate depending on the type of the secondary battery.

Referring to FIG. 4, the SOC of secondary battery 6 has a corresponding relationship with an electromotive voltage OCV. Accordingly, estimated SOC calculation unit 28 obtains a mapped value corresponding to electromotive voltage #OCV of secondary battery 6 by referring to the previously stored map as shown in FIG. 4 to thereby allow the estimated SOC (#SOCb) to be calculated in a range of 0-100(%).

Again referring to FIG. 3, SOC calculation unit 40 receives the provisional SOC (#SOCa) and the estimated SOC (#SOCb) from provisional SOC calculation unit 30 and estimated SOC calculation unit 28, respectively, and corrects the provisional SOC (#SOCa) with the correction value calculated by the predetermined processing, to thereby generate a remaining-amount (SOC) estimation value of secondary battery 6. In other words, SOC calculation unit 40 acts as an integrating element (I element) for correcting the provisional SOC (#SOCa) such that it approaches the estimated SOC (#SOCb).

Specifically, SOC calculation unit 40 calculates the correction value based on the magnitude of the SOC estimation value (also hereinafter referred to as an "SOC estimation value (last calculated value)") estimated at the time of the last remaining-amount estimation and the magnitude relationship between the SOC estimation value (last calculated value) and the estimated SOC (#SOCb). SOC calculation unit 40 includes a subtracting unit 42, a correction value calculation unit 50, and an adding unit 52.

Subtracting unit 42 receives the estimated SOC (#SOCb) calculated by estimated SOC calculation unit 28 and the SOC estimation value (last calculated value) to calculate a deviation of the SOC estimation value (last calculated value) with respect to the estimated SOC (#SOCb) (=estimated SOC (#SOCb)−SOC estimation value (last calculated value)). Subtracting unit 42 then outputs the calculated deviation to correction value calculation unit 50.

Correction value calculation unit 50 receives the deviation from subtracting unit 42 and multiplies the deviation by a plurality of correction gains to calculate a correction value. Correction value calculation unit 50 includes a conversion gain unit 44, an SOC-estimation-value-depending gain selection unit 46 and a battery-temperature-depending gain selection unit 48, and sequentially multiplies the deviation by the correction gain in each unit to calculate a correction value.

Conversion gain unit 44 has a conversion gain K which is a fixed value and adjusts the deviation such that the scope of the correction value to be output is appropriately set depending on the variable scope of the deviation to be input.

SOC-estimation-value-depending gain selection unit 46 selects a correction gain G1 based on the magnitude of the SOC estimation value (last calculated value) and the magnitude relationship between the SOC estimation value (last calculated value) and the estimated SOC (#SOCb). By way of example, SOC-estimation-value-depending gain selection unit 46 may previously store the map, in which the SOC estimation value (last calculated value) and the estimated SOC each are defined as an input (parameter), to select correction gain G1 by referring to the map. In SOC-estimation-value-depending gain selection unit 46, the deviation obtained after the multiplication by conversion gain K in conversion gain unit 44 is further multiplied by its correction gain G1 for output.

Battery-temperature-depending gain selection unit 48 selects a correction gain G3 based on battery temperature Tb. By way of example, battery-temperature-depending gain selection unit 48 may also previously store the map in which battery temperature Tb and the estimated SOC (#SOCb) each are defined as an input (parameter) to select correction gain G3 by referring to the map. In battery-temperature-depending gain selection unit 48, the value obtained after the multiplication by correction gain G1 in SOC-estimation-value-depending gain selection unit 46 is further multiplied by its correction gain G3 to output the result as a correction value ΔSOC.

The selection of the correction gain in SOC-estimation-value-depending gain selection unit 46 and battery-temperature-depending gain selection unit 48 will be described below in detail.

Adding unit 52 receives correction value ΔSOC from battery-temperature-depending gain selection unit 48 and adds correction value ΔSOC to provisional SOC (#SOCa) received from provisional SOC calculation unit 30 to output the result as an SOC estimation value.

(SOC-Estimation-Value-Depending Gain Selection Unit)

The selection of correction gain G1 in SOC-estimation-value-depending gain selection unit 46 will be described below in detail.

FIG. 5A shows the case where the SOC estimation value is relatively large (in proximity to excessive charging) and FIG. 5B shows the case where the SOC estimation value is relatively small (in proximity to excessive discharging).

Referring to FIG. 5A, SOC-estimation-value-depending gain selection unit 46 calculates a deviation of the SOC estimation value (last calculated value) with respect to the estimated SOC (#SOCb) and multiplies the deviation by the predetermined correction gain to calculate a correction value. Accordingly, if the estimated SOC (#SOCb)<the SOC estimation value (last calculated value), negative deviation occurs, with the result that a negative correction value is added to the SOC provisional value (#SOCa), and then, the SOC estimation value is continuously corrected so as to approach the estimated SOC (#SOCb) indicating a smaller value.

Therefore, for example, in the case where the charging of secondary battery 6 is continued, if the SOC estimation value is larger than the estimated SOC (#SOCb) while the SOC estimation value indicates a value in proximity to excessive charging, the SOC estimation value is corrected in the opposite direction (low SOC side) to the excessive charging side. Consequently, if an error occurs in the estimated SOC (#SOCb) caused by the measurement accuracy and the like in voltage measurement unit 12, current measurement unit 14 and temperature measurement unit 16, a relatively small SOC estimation value may be calculated while secondary battery 6 is in the excessive charging state.

Furthermore, referring to FIG. 5B, if the estimated SOC (#SOCb)>the SOC estimation value (last calculated value), positive deviation occurs, with the result that a positive correction value is added to the SOC provisional value (#SOCa) and the SOC estimation value is continuously corrected so as to approach the estimated SOC (#SOCb) indicating a larger value.

Therefore, for example, in the case where the discharging of secondary battery 6 is continued, if the SOC estimation value is smaller than the estimated SOC (#SOCb) while the SOC estimation value indicates a value in proximity to excessive discharging, the SOC estimation value is corrected in the opposite direction (high SOC side) to the excessive discharging side. Consequently, if an error occurs in the estimated SOC (#SOCb) caused by the measurement accuracy and the like in voltage measurement unit 12, current measurement unit 14 and temperature measurement unit 16, a relatively large SOC estimation value may be calculated while secondary battery 6 is in the excessive discharging state.

Thus, in such a case, SOC-estimation-value-depending gain selection unit 46 relatively decreases correction gain G1 to thereby avoid the calculation of the excessive correction value and calculate the SOC estimation value so as to indicate the safe side (toward the excessive charging side or toward the excessive discharging side) value for secondary battery 6 in the charge/discharge control.

Figure 6:
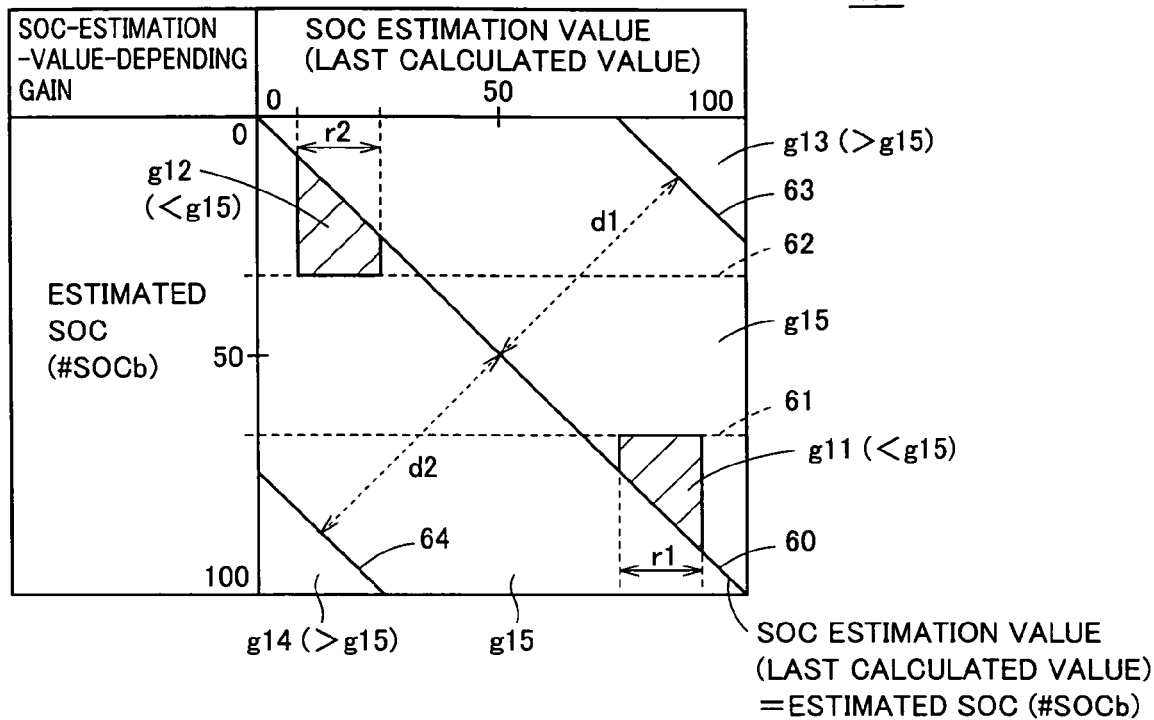
FIG. 6 shows an example of a map stored in an SOC-estimation-value-depending gain selection unit.

Referring to FIG. 6, a map 46# is a two-dimensional map in which the SOC estimation value (last calculated value) and the estimated SOC (#SOCb) each are defined as an input, and the mapped value to be output corresponds to correction gain G1. This correction gain G1 is a correction gain which is multiplied in SOC-estimation-value-depending gain selection unit 46 in FIG. 3.

Map 46# has regions defined by an SOC range r1 in which the SOC estimation value (last calculated value) is in proximity to excessive charging, an SOC range r2 in which the SOC estimation value (last calculated value) is in proximity to excessive discharging, and characteristic lines 60-64. Characteristic line 60 shows the position where the SOC estimation value (last calculated value) matches the estimated SOC (#SOCb). Characteristic lines 61 and 62 each show the position where the estimated SOC (#SOCb) corresponds to a predetermined value. Characteristic line 63 shows the position where the deviation of the SOC estimation value with respect to the estimated SOC (#SOCb) corresponds to −d1. Characteristic line 64 shows the position where the deviation of the SOC estimation value with respect to the estimated SOC (#SOCb) corresponds to d2.

In map 46#, on the condition that the SOC estimation value (last calculated value) is within SOC range r1 in proximity to the excessive charging of secondary battery 6 and the estimated SOC (#SOCb) is not less than the predetermined value (below characteristic line 61), a gain value g11 in the case where the SOC estimation value (last calculated value) is greater than the estimated SOC (#SOCb) (above characteristic line 60) is set to a value smaller than a gain value g15 in the case where the SOC estimation value (last calculated value) is smaller than the estimated SOC (#SOCb) (below characteristic line 60).

For example, SOC range r1 is selected such that it corresponds to the charge limited range (state values S3-S4) as shown in FIG. 2. In other words, in the case where the SOC estimation value (last calculated value) has increased to the charge limited value (state value S3), the correction is performed toward the safe side (correction gain G1 is relatively decreased). On the other hand, after the SOC estimation value (last calculated value) increases to the charge inhibited value (state value S4), secondary battery 6 is inhibited from being charged. Consequently, it is desirable to further enhance the followability to improve the estimation accuracy (to reset or relatively increase correction gain G1).

As mentioned above, in the case where the SOC estimation value (last calculated value) is within SOC range r1 in proximity to the excessive charging, the above-described correction toward the safe side (relatively decreasing the correction gain) is required, which is the case when the SOC estimation value (last calculated value) is greater than the estimated SOC (#SOCb). Thus, the region in which gain value g11 is set in map 46# corresponds to the region above characteristic line 60, and gain value g15 greater than gain value g11 is set in the region below characteristic line 60.

Furthermore, in map 46#, the region having smaller gain value g11 set therein is limited to below characteristic line 61 where the estimated SOC (#SOCb) is not less than the predetermined value.

According to the relationship between the electromotive voltage of secondary battery 6 and the SOC as shown in FIG. 4, the variation amount of the electromotive voltage relative to the SOC variation is increased as approaching the excessive charging side (relatively large SOC) or excessive discharging side (relatively small SOC) with respect to 50%. In other words, when the SOC is in proximity to 50%, the electromotive voltage variation relative to the SOC variation is relatively small (the sensitivity to the SOC variation is low), which causes a relatively large estimation error of the estimated SOC (#SOCb). Therefore, it is desirable to further enhance the followability to improve the estimation accuracy in the above-mentioned region where the estimation error of the estimated SOC (#SOCb) becomes relatively large.

Thus, in map 46#, depending on the electromotive voltage characteristic of secondary battery 6, the region in which the measurement error of the estimated SOC (#SOCb) becomes relatively large is defined by characteristic lines 61 and 62. In the region in which the measurement error of the SOC is relatively small, that is, the region below characteristic line 61 and the region above characteristic line 62, a smaller gain is set.

Further, in map 46#, on the condition that the SOC estimation value (last calculated value) is within SOC range r2 in proximity to the excessive discharging of secondary battery 6 and the estimated SOC (#SOCb) is not more than the predetermined value (above characteristic line 62), a gain value g12 in the case where the SOC estimation value is smaller than the estimated SOC (#SOCb) (below characteristic line 60) is set to a value smaller than gain value g15 in the case where the SOC estimation value (last calculated value) is greater than the estimated SOC (#SOCb) (above characteristic line 60).

For example, SOC range r2 is selected such that it corresponds to the discharge limited range (state values S2-S1) as shown in FIG. 2. In other words, in the case where the SOC estimation value (last calculated value) has decreased to the discharge limited value (state value S2), the correction is performed further toward the safe side (the correction gain is relatively decreased). On the other hand, after the SOC estimation value (last calculated value) decreases to the discharge inhibited value (state value S1), secondary battery 6 is inhibited from being discharged. Consequently, it is desirable to enhance the followability to improve the estimation accuracy (reset or relatively increase the correction gain).

As mentioned above, in the case where the SOC estimation value (last calculated value) is within SOC range r2 in proximity to the excessive discharging, the above-described correction toward the safe side (relatively decreasing the correction gain) is required, which is the case when the SOC estimation value (last calculated value) is smaller than the estimated SOC (#SOCb). Thus, the region in which gain value g12 is set in map 46# corresponds to the region below characteristic line 60, and gain value g15 greater than gain value g12 is set in the region above characteristic line 60.

Furthermore, as described above, in the region in which the SOC measurement error is relatively small, that is, the region above characteristic line 62, smaller gain value g12 is set.

Furthermore, in map 46#, in the case where the SOC estimation value (last calculated value) excessively deviates from the estimated SOC (#SOCb), in order to further enhance the followability to improve the estimation accuracy (further increase the correction gain), gain values g13 and g14 which are greater than gain value g15 are set for the region having an absolute value of the deviation greater than |d1| (region above characteristic line 63) and the region having an absolute value of the deviation greater than |d2| (region below characteristic line 64), respectively.

Therefore, in map 46#, the relation of gain values g11, g12<gain value g15<gain values g13, g14 is assumed.

Although, in the above-described map 46#, the case where deviations d1 and d2 for defining characteristic lines 63 and 64, respectively, are independent of each other has been described, the relation of |d1|=|d2| may be assumed in order to symmetrically calculate the correction value on the excessive charging side and the excessive discharging side. For the same reason, the relation of gain value g11=gain value g12, and, gain value g13=gain value g14 may also be assumed. Furthermore, the regions of gain values g12, g13, g14, and g15 may be subdivided to set a gain value for each subdivided region, as far as there is the technical meaning similar to that described above.

(Battery-Temperature-Depending Gain Selection Unit)

The selection of correction gain G3 in a battery-temperature-depending gain selection unit 48 will be hereinafter described in detail.

Figure 7:
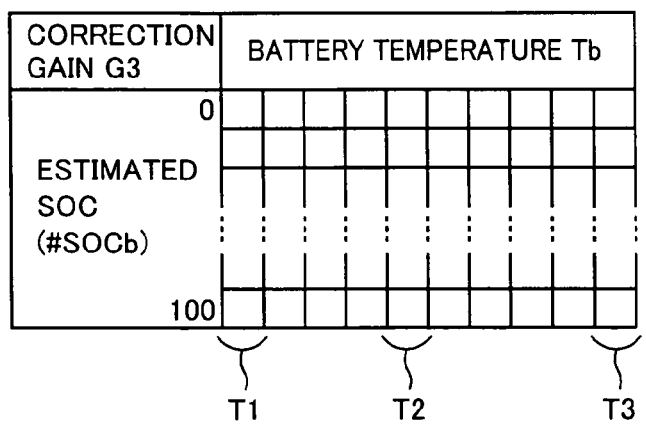
FIG. 7 shows a structure of a map stored in a battery-temperature-depending gain selection unit.

Referring FIG. 7, map 48# is a two-dimensional map in which battery temperature Tb and the estimated SOC (#SOCb) each are defined as an input (parameter), and the mapped value to be output corresponds to correction gain G3. This correction gain G3 is a correction gain which is multiplied in battery-temperature-depending gain selection unit 48 in FIG. 3.

Secondary battery 6 uses chemical reaction to charge and discharge the electric energy (electric charge). This chemical reaction having its activity affected by the battery temperature is further activated as battery temperature Tb rises. Due to this increased activity, an electromotive voltage estimation value #OCV of secondary battery 6 tends to fluctuate, so that the estimated SOC (#SOCb) also relatively greatly fluctuates. Thus, it is desirable to relatively increase correction gain G3 to enhance the followability and improve the estimation accuracy of the remaining-amount estimation value.

Further, also in the case where the estimated SOC is in proximity to excessive charging or excessive discharging, electromotive voltage estimation value #OCV of secondary battery 6 tends to fluctuate. Thus, it is desirable to relatively increase correction gain G3 to enhance the followability and improve the estimation accuracy of the remaining-amount estimation value.

Thus, map 48# is set such that correction gain G3 indicating the above-described characteristic is selected.

Figure 8:
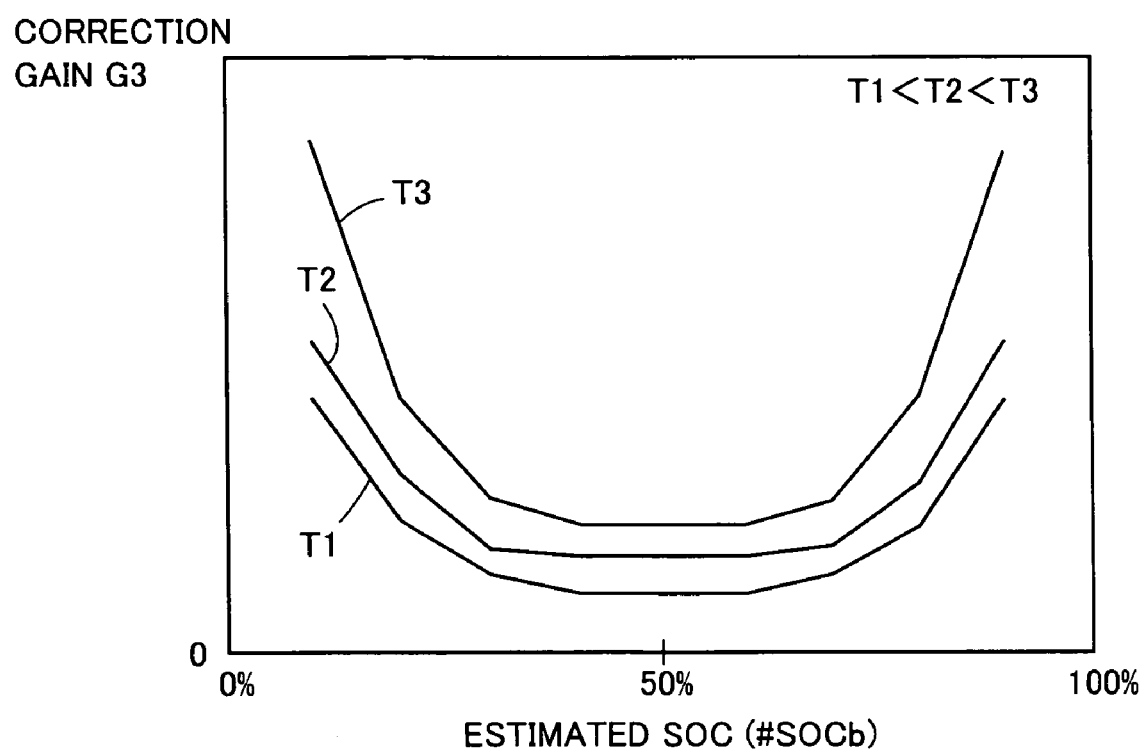
FIG. 8 shows an example of a variation in a correction gain related to an estimated SOC in the map.

FIG. 8 shows a variation in correction gain G3 related to the estimated SOC (#SOCb) in map 48#. It is to be noted that temperatures T1, T2 and T3 in FIG. 8 correspond to temperatures T1, T2 and T3 (T1<T2<T3), respectively, shown in map 48# in FIG. 7.

Referring to FIG. 8, in map 48#, even when battery temperature Tb corresponds to any of temperatures T1, T2 and T3, correction gain G3 is set so as to increase as the estimated SOC (#SOCb) is displaced with respect to 50% toward the excessive charging side or excessive discharging side. Battery-temperature-depending gain selection unit 48 sets correction gain G3 on the excessive charging side and the excessive discharging side to be relatively increased, to thereby further improve the estimation accuracy.

Furthermore, in map 48#, correction gain G3 corresponding to each estimated SOC (#SOCb) is set to be increased as battery temperature Tb of secondary battery 6 rises. In other words, the characteristic line showing correction gain G3 will shift upward in the graph as battery temperature Tb rises. Thus, correction gain G3 is increased as battery temperature Tb of secondary battery 6 rises, which allows the SOC estimation value for secondary battery 6 to be calculated with stability and high accuracy while the variation in battery temperature Tb.

In the first embodiment of the present invention, provisional SOC calculation unit 30 corresponds to the "first estimation unit", estimated SOC calculation unit 28 corresponds to the "second estimation unit", SOC calculation unit 40 corresponds to the "correction unit", and electromotive voltage calculation unit 20 corresponds to the "electromotive voltage calculation unit." Subtracting unit 42 corresponds to the "deviation calculation unit", correction value calculation unit 50 corresponds to the "correction value calculation unit", and adding unit 52 corresponds to the "estimation value calculation unit." Furthermore, SOC-estimation-value-depending gain selection unit 46 corresponds to the "first correction gain selection unit" and battery-temperature-depending gain selection unit 48 corresponds to the "third correction gain selection unit".

In the above-described first embodiment of the present invention, although the configuration in which SOC-estimation-value-depending gain selection unit 46 and battery-temperature-depending gain selection unit 48 included in correction value calculation unit 50 calculate correction value ΔSOC by multiplying correction gains G1 and G3, respectively, has been described, the correction value calculation unit may be configured to include one of SOC-estimation-value-depending gain selection unit 46 and battery-temperature-depending gain selection unit 48. In other words, even in the case of the configuration in which correction value ΔSOC is calculated by multiplication by one of correction gain G1 selected by SOC-estimation-value-depending gain selection unit 46 and correction gain G3 selected by battery-temperature-depending gain selection unit 48, the remaining amount of the secondary battery can be estimated with high accuracy while avoiding excessive charging and excessive discharging with more stability.

According to the first embodiment of the present invention, SOC-estimation-value-depending gain selection unit 46 selects relatively small correction gain G1 in the case where the SOC estimation value (last calculated value) lies in the range in proximity to excessive charging and the SOC estimation value (last calculated value) is corrected to a smaller value (toward the SOC control center). Furthermore, SOC-estimation-value-depending gain selection unit 46 selects relatively small correction gain G1 in the case where the SOC estimation value (last calculated value) lies in the range in proximity to excessive discharging and the SOC estimation value (last calculated value) is corrected to a larger value (toward the SOC control center).

Thus, when the SOC estimation value (last calculated value) is in the range in proximity to excessive charging or excessive discharging, the remaining-amount estimation value is calculated so as to indicate the safe side (further excessive charging side or further excessive discharging side) value for the secondary battery in charge/discharge control. Consequently, the remaining amount of the secondary battery can be estimated with high accuracy while avoiding excessive charging and excessive discharging with more stability.

Furthermore, according to the first embodiment of the present invention, in accordance with the increase in battery temperature Tb, battery-temperature-depending gain selection unit 48 relatively increases correction gain G3 depending on the estimated SOC (#SOCb) that may fluctuate relatively greatly, to thereby enhance the followability and improve the estimation accuracy of the remaining-amount estimation value. In addition, as approaching the range of excessive charging or excessive discharging, battery-temperature-depending gain selection unit 48 relatively increases correction gain G3 depending on the estimated SOC (#SOCb) that may fluctuate relatively greatly, to thereby enhance the followability and improve the estimation accuracy of the remaining-amount estimation value.

Consequently, even in the case where the estimation accuracy of the remaining-amount estimation value tends to deteriorate, such as in the case where battery temperature Tb is high and/or in the case of being in the range in proximity to excessive charging or excessive discharging, it is possible to enhance the followability to improve the estimation accuracy. Accordingly, the remaining amount of the secondary battery can be estimated with high accuracy while avoiding excessive charging and excessive discharging with more stability.

Second Embodiment

In the above-described first embodiment of the present invention, the configuration in which correction value ΔSOC is calculated by the correction gains selected based on the SOC estimation value (last calculated value), the estimated SOC (#SOCb) and the battery temperature, respectively, has been described. In the second embodiment of the present invention, the configuration in which correction value ΔSOC is calculated by the correction gains selected based on the input/output current, the estimated SOC (#SOCb) and the battery temperature, respectively, will be described.

Figure 9:
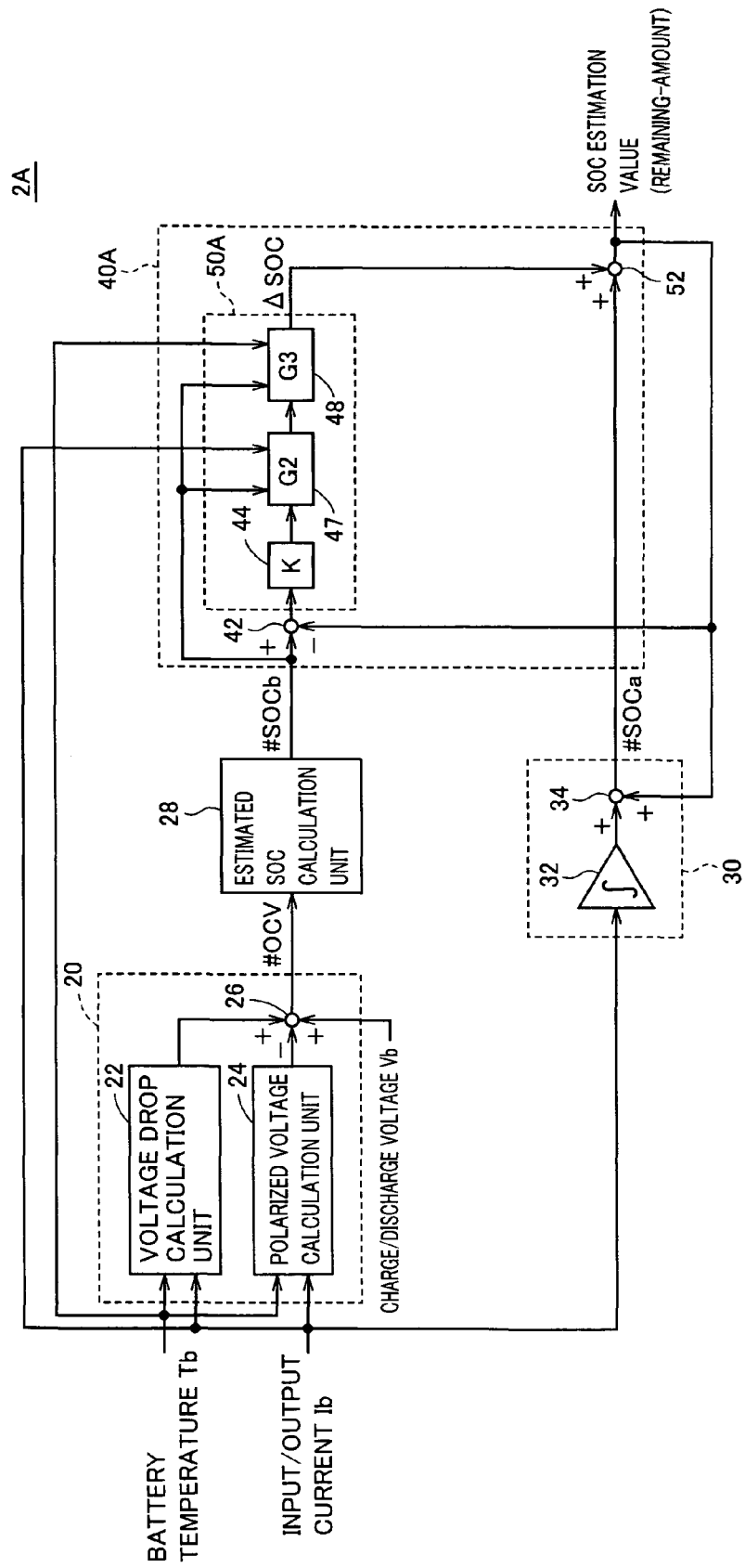
FIG. 9 is a block diagram of the process in an SOC estimation unit according to a second embodiment of the present invention.

Referring to FIG. 9, an SOC estimation unit 2A according to the second embodiment of the present invention is equivalent to SOC estimation unit 2 according to the first embodiment of the present invention shown in FIG. 3 except that it has an SOC calculation unit 40A in place of SOC calculation unit 40, to which SOC calculation unit 40A is equivalent except that it has a correction value calculation unit 50A in place of correction value calculation unit 50, to which correction value calculation unit 50A is equivalent except that it has an input/output-current-depending gain selection unit 47 in place of SOC-estimation-value-depending gain selection unit 46.

Input/output-current-depending gain selection unit 47 selects a correction gain G2 based on the relationship between input/output current Ib of secondary battery 6 received from current measurement unit 14 and the estimated SOC (#SOCb) received from estimated SOC calculation unit 28. By way of example, input/output-current-depending gain selection unit 47 can previously store the map in which input/output current Ib and the estimated SOC (#SOCb) each are defined as an input (parameter) to select correction gain G2 by referring to the map. In input/output-current-depending gain selection unit 47, the deviation obtained after the multiplication by conversion gain K in conversion gain unit 44 is further multiplied by its correction gain G2 for output.

Since others are the same as in SOC estimation unit 2 according to the first embodiment of the present invention, detailed description thereof will not be repeated.

(Input/Output-Current-Depending Gain Selection Unit)

The selection of correction gain G2 in input/output-current-depending gain selection unit 47 will be hereinafter described in detail.

Again referring to FIG. 4, according to the relationship between the electromotive voltage of secondary battery 6 and the SOC, the variation amount of the electromotive voltage relative to the SOC variation is increased as approaching the excessive charging side (relatively large SOC) or excessive discharging side (relatively small SOC) with respect to 50%.

Accordingly, if the input current (charging current) to secondary battery 6 is large in the case where secondary battery 6 approaches the excessive charging state, the estimated SOC (#SOCb) may greatly fluctuate. Similarly, if the output current (discharging current) from secondary battery 6 is large in the case where secondary battery 6 approaches the excessive discharging state, the estimated SOC (#SOCb) may greatly fluctuate. Thus, in this case, it is desirable to set correction value ΔSOC to a larger value, to thereby enhance the followability and improve the estimation accuracy.

Figure 10:
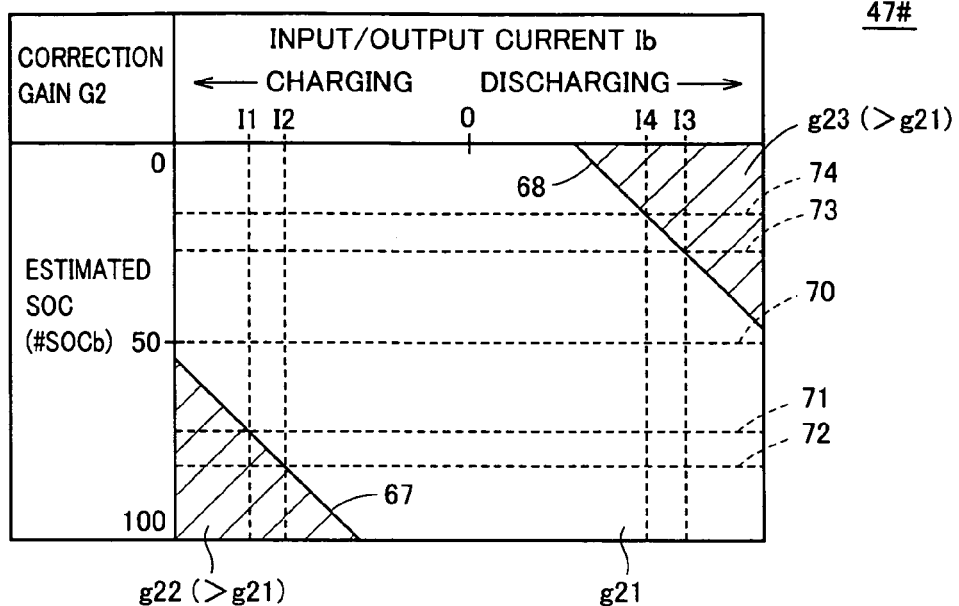
FIG. 10 shows an example of a map stored in an input/output-current-depending gain selection unit.

Referring to FIG. 10, a map 47# stored in input/output-current-depending gain selection unit 47 is a two-dimensional map in which input/output current Ib of secondary battery 6 and the estimated SOC (#SOCb) each are defined as an input (parameter), and the mapped value to be output corresponds to correction gain G2. This correction gain G2 is a correction gain which is multiplied in input/output-current-depending gain selection unit 47 in FIG. 9.

In map 47#, in the case where the estimated SOC (#SOCb) is not less than the predetermined value in proximity to excessive charging of secondary battery 6 (estimated SOC (#SOCb) corresponding to any input/output current Ib on a characteristic line 67), correction gain G2 to be output is set to be increased as the input current to secondary battery 6 increases. On the other hand, in the case where the estimated SOC (#SOCb) is not more than the predetermined value in proximity to excessive discharging of secondary battery 6 (estimated SOC (#SOCb) corresponding to any input/output current Ib on a characteristic line 68), correction gain G2 to be output is set to be increased as the output current to secondary battery 6 increases.

In other words, in the region below characteristic line 67 and the region above characteristic line 68, gain values g22 and g23 are set, respectively, which are greater than a gain value g21 set in the other region. Characteristic lines 67 and 68 are determined as appropriate depending on a full charge capacity (Ah) of secondary battery 6, an input/output current value (A), an electromotive voltage characteristic relative to the SOC, and the like. Furthermore, in map 47#, the regions of gain values g21 and g22 are further subdivided for setting each gain value and correction gain G2 to be output is set to be increased as the input current or output current increases.

Figure 11A:
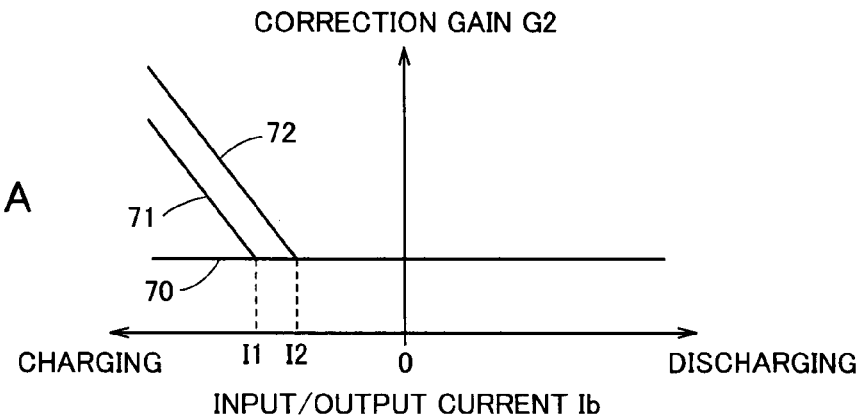
FIGS. 11A and 11B are diagrams for describing a gain characteristic corresponding to each estimated SOC in the map shown in FIG. 10.
Figure 11B:
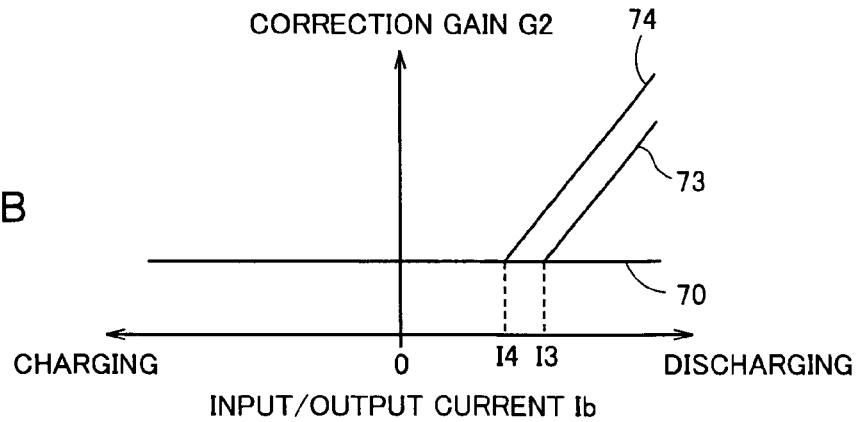

FIGS. 11A and 11B are diagrams for describing gain characteristics 70-74 corresponding to each estimated SOC (#SOCb) in map 47# shown in FIG. 10. Reference characters 70-74 in FIGS. 11A and 11B correspond to reference characters 70-74 in FIG. 10, respectively.

FIG. 11A shows the case where the estimated SOC (#SOCb) is relatively large (in proximity to excessive charging) and FIG. 11B shows the case where the estimated SOC (#SOCb) is relatively small (in proximity to excessive discharging).

Referring to FIGS. 10 and 11A, for example, since a gain characteristic 70 in which the estimated SOC (#SOCb) is 50% does not intersect characteristic lines 67 and 68, gain value g21 which is a fixed value is selected independently of input/output current Ib.

On the other hand, since a gain characteristic 71 corresponding to the estimated SOC (#SOCb) greater than the estimated SOC (#SOCb) corresponding to gain characteristic 70 intersects characteristic line 67, correction gain G2 starts to increase when input/output current Ib exceeds a predetermined input current value I1.

Furthermore, as to a larger gain characteristic 72 corresponding to the larger estimated SOC (#SOCb), correction gain G2 starts to increase when input/output current Ib exceeds an input current value I2 smaller than input current value I1.

Thus, in map 47#, in the case where the estimated SOC (#SOCb) is not less than the predetermined value defined by characteristic line 67, correction gain G2 to be output is set to be increased as the input current (charging current) increases and the estimated SOC (#SOCb) increases.

On the other hand, referring to FIGS. 10 and 11B, since a gain characteristic 73 corresponding to the estimated SOC (#SOCb) smaller than the estimated SOC (#SOCb) corresponding to gain characteristic 70 intersects characteristic line 68, correction gain G2 starts to increase when input/output current Ib exceeds a predetermined output current value I3.

Furthermore, as to a gain characteristic 74 corresponding to the smaller estimated SOC (#SOCb), correction gain G2 starts to increase when input/output current Ib exceeds an output current value I4 smaller than output current value I3.

Thus, in map 47#, in the case where the estimated SOC (#SOCb) is not less than the predetermined value defined by characteristic line 68, correction gain G2 to be output is set to be increased as the output current (discharging current) increases and/or the estimated SOC (#SOCb) decreases.

As described above, correction gain G2 is set to be increased for the input current causing secondary battery 6 to be excessively charged or the output current causing secondary battery 6 to be excessively discharged, which allows the SOC estimation value for secondary battery 6 to be calculated with stability and high accuracy.

In the second embodiment of the present invention, provisional SOC calculation unit 30 corresponds to the "first estimation unit", estimated SOC calculation unit 28 corresponds to the "second estimation unit", SOC calculation unit 40A corresponds to the "correction unit", and electromotive voltage calculation unit 20 corresponds to the "electromotive voltage calculation unit." Subtracting unit 42 corresponds to the "deviation calculation unit", correction value calculation unit 50A corresponds to the "correction value calculation unit", and adding unit 52 corresponds to the "estimation value calculation unit." Furthermore, input/output-current-depending gain selection unit 47 corresponds to the "first correction gain selection unit" and battery-temperature-depending gain selection unit 48 corresponds to the "third correction gain selection unit".

In the above-described second embodiment of the present invention, although the configuration in which input/output-current-depending gain selection unit 47 and battery-temperature-depending gain selection unit 48 included in correction value calculation unit 50A calculate correction value ΔSOC by multiplying correction gains G2 and G3, respectively, has been described, the correction value calculation unit may be configured to include one of input/output-current-depending gain selection unit 47 and battery-temperature-depending gain selection unit 48. In other words, even in the case of the configuration in which correction value ΔSOC is calculated by multiplying one of correction gain G2 selected by input/output-current-depending gain selection unit 47 and correction gain G3 selected by battery-temperature-depending gain selection unit 48, the remaining amount of the secondary battery can be estimated with high accuracy while avoiding excessive charging and excessive discharging with stability.

According to the second embodiment of the present invention, in the state where the estimated SOC (#SOCb) may greatly fluctuate such as in the case of being in proximity to excessive charging and of the input current (charging current) being large, or, in the case of being in proximity to excessive discharging and of the output current (discharging current) being large, input/output-current-depending gain selection unit 47 relatively increases correction gain G2 to enhance the followability and improve the estimation accuracy of the remaining-amount estimation value.

Thus, in the range in proximity to excessive charging or excessive discharging, even in the case where the estimation accuracy of the remaining-amount estimation value tends to deteriorate, it is possible to enhance the followability and improve the estimation accuracy. Therefore, the remaining amount of the secondary battery can be estimated with high accuracy while avoiding excessive charging and excessive discharging with more stability.

Furthermore, according to the second embodiment of the present invention, in accordance with the increase in battery temperature Tb, battery-temperature-depending gain selection unit 48 relatively increases correction gain G3 depending on the estimated SOC (#SOCb) that may fluctuate relatively greatly, to thereby enhance the followability and improve the estimation accuracy of the remaining-amount estimation value. In addition, as approaching the range of excessive charging or excessive discharging, battery-temperature-depending gain selection unit 48 relatively increases correction gain G3 depending on the estimated SOC (#SOCb) that may fluctuate relatively greatly, to thereby enhance the followability and improve the estimation accuracy of the remaining-amount estimation value.

Consequently, even in the case where the estimation accuracy of the remaining-amount estimation value tends to deteriorate, such as in the case where battery temperature Tb is high and/or in the case of being in the range in proximity to excessive charging or excessive discharging, it is possible to enhance the followability to improve the estimation accuracy. Accordingly, the remaining amount of the secondary battery can be estimated with high accuracy while avoiding excessive charging and excessive discharging with more stability.

Third Embodiment

In the above-described first and second embodiments of the present invention, the configuration in which the correction value is calculated by the correction gains selected based on the SOC estimation value (last calculated value), the estimated SOC (#SOCb) and the battery temperature, and the configuration in which the correction value is calculated by the correction gains selected based on the input/output current, the estimated SOC (#SOCb) and the battery temperature have been described, respectively. In the third embodiment of the present invention, the configuration in which the correction value is calculated by all the above correction gains will be described.

Figure 12:
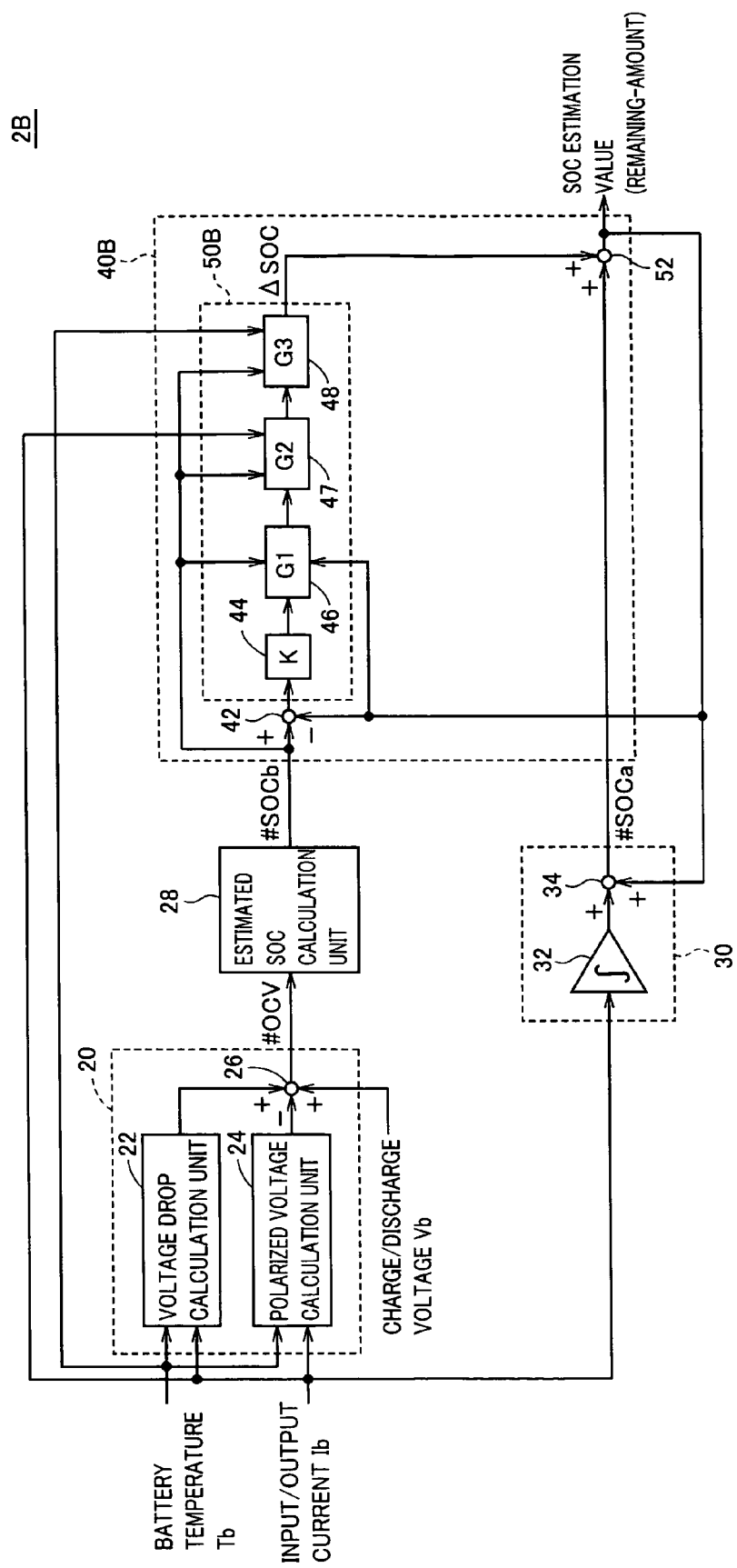
FIG. 12 is a block diagram of the process in an SOC estimation unit according to a third embodiment of the present invention.

Referring to FIG. 12, an SOC estimation unit 2B according to the third embodiment of the present invention is equivalent to SOC estimation unit 2 according to the first embodiment of the present invention shown in FIG. 3 except that it has an SOC calculation unit 40B in place of SOC calculation unit 40, to which SOC calculation unit 40B is equivalent except that it has a correction value calculation unit 50B in place of correction value calculation unit 50. Furthermore, correction value calculation unit 50B is equivalent to correction value calculation unit 50 except that it further includes input/output-current-depending gain selection unit 47 shown in FIG. 9.

Since others are the same as in SOC estimation unit 2 according to the first embodiment of the present invention, detailed description thereof will not be repeated.

As described in detail in the above first and second embodiments of the present invention, SOC-estimation-value-depending gain selection unit 46, input/output-current-depending gain selection unit 47, and battery-temperature-depending gain selection unit 48 each select a correction gain so as to estimate the remaining amount of the secondary battery with high accuracy while avoiding excessive charging and excessive discharging with stability. Therefore, SOC calculation unit 40B can calculate the SOC estimation value obtained by estimating the remaining amount of the secondary battery with higher accuracy while avoiding excessive charging and excessive discharging with more stability, as compared to the first and second embodiments.

In the third embodiment of the present invention, provisional SOC calculation unit 30 corresponds to the "first estimation unit", estimated SOC calculation unit 28 corresponds to the "second estimation unit", SOC calculation unit 40B corresponds to the "correction unit", and electromotive voltage calculation unit 20 corresponds to the "electromotive voltage calculation unit." Subtracting unit 42 corresponds to the "deviation calculation unit", correction value calculation unit 50B corresponds to the "correction value calculation unit", and adding unit 52 corresponds to the "estimation value calculation unit." Furthermore, SOC-estimation-value-depending gain selection unit 46 corresponds to the "first correction gain selection unit", input/output-current-depending gain selection unit 47 corresponds to the "second correction gain selection unit", and battery-temperature-depending gain selection unit 48 corresponds to the "third correction gain selection unit".

According to the third embodiment of the present invention, any effects both in the above-described first and second embodiments of the present invention can be achieved.

Although, in the first to third embodiments of the present invention, the vehicle incorporating the remaining-amount estimation device for the secondary battery according to the present invention has been described, the present invention is applicable to any device and system for the secondary battery configured to be charged and discharged based on the SOC estimation value.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

The invention claimed is:

1. A remaining-amount estimation device for a chargeable secondary battery, comprising:
   a first estimation unit calculating a first estimation value for a remaining amount of said secondary battery based on a charging/discharging amount of said secondary battery from a time of a last remaining-amount estimation;
   a second estimation unit calculating a second estimation value for the remaining amount of said secondary battery based on a state value of said secondary battery; and
   a correction unit correcting said first estimation value based on a correction value in accordance with a deviation of a last calculated value of the remaining amount from said second estimation value, the last calculated value of the remaining amount being a remaining-amount estimation value of said secondary battery estimated at the time of the last remaining-amount estimation, and generating the remaining-amount estimation value of said secondary battery,
   said correction unit calculating said correction value based on a magnitude of said last calculated value of the remaining amount and a magnitude relationship between said last calculated value of the remaining amount and said second estimation value.

2. The remaining-amount estimation device for the secondary battery according to claim 1, wherein said correction unit includes
   a deviation calculation unit calculating said deviation receiving said second estimation value and said last calculated value of the remaining amount, a correction value calculation unit calculating the correction value by multiplying said deviation received from said deviation calculation unit by at least one correction gain, and an estimation value calculation unit adding said correction value received from said correction value calculation unit to said first estimation value received from said first estimation unit, for output, said at least one correction gain including a first correction gain, and said correction value calculation unit including a first correction gain selection unit selecting said first correction gain based on the magnitude of said last calculated value of the remaining amount and the magnitude relationship between said last calculated value of the remaining amount and said second estimation value.

3. The remaining-amount estimation device for the secondary battery according to claim 2, wherein said first correction gain selection unit, on a condition that said last calculated value of the remaining amount is within a first range in proximity to excessive charging of said secondary battery and said second estimation value is not less than a first predetermined value, decreases said first correction gain in a case where said last calculated value of the remaining amount is greater than said second estimation value as compared to a case where said last calculated value of the remaining amount is smaller than said second estimation value, and, on a condition that said last calculated value of the remaining amount is within a second range in proximity to excessive discharging of said secondary battery and said second estimation value is not more than a second predetermined value, decreases said first correction gain in a case where said last calculated value of the remaining amount is smaller than said second estimation value as compared to a case where said last calculated value of the remaining amount is greater than said second estimation value.

4. The remaining-amount estimation device for the secondary battery according to claim 2, wherein said first correction gain selection unit selects said first correction gain by referring to a predetermined map in which said last calculated value of the remaining amount and said second estimation value each are defined as an input.

5. The remaining-amount estimation device for the secondary battery according to claim 2, wherein said at least one correction gain further includes a second correction gain, and said correction value calculation unit further includes a second correction gain selection unit selecting said second correction gain based on a relationship between an input/output current of said secondary battery for chuging/discharging said secondary battery and said second estimation value.

6. The remaining-amount estimation device for the secondary battery according to claim 5, wherein said second correction gain selection unit, in a case where said second estimation value is not less than a third predetermined value in proximity to excessive charging of said secondary battery, increases said second correction gain as the input current to said secondary battery increases; and, in a case where said second estimation value is not more than a fourth predetermined value in proximity to excessive discharging of said secondary battery, increases said second correction gain as the output current to said secondary battery increases.

7. The remaining-amount estimation device for the secondary battery according to claim 5, wherein said second correction gain selection unit selects said second correction gain by referring to the predetermined map in which the input/output current of said secondary battery and said second estimation value each are defined as an input.

8. The remaining-amount estimation device for the secondary battery according to claim 2, wherein said at least one correction gain further includes a third correction gain, and said correction value calculation unit further includes a third correction gain selection unit selecting said third correction gain based on a battery temperature of said secondary battery.

9. The remaining-amount estimation device for the secondary battery according to claim 8, wherein said third correction gain selection unit increases said third correction gain as the battery temperature of said secondary battery increases.

10. The remaining-amount estimation device for the secondary battery according to claim 1, wherein said first estimation unit obtains the charging/discharging amount of said secondary battery based on an integrated value of the input/output current of said secondary battery.

11. The remaining-amount estimation device for the secondary battery according to claim 1, wherein said second estimation unit calculates said second estimation value based on an electromotive voltage of said secondary battery.

12. The remaining-amount estimation device for the secondary battery according to claim 11, further including an electromotive voltage calculation unit calculating the electromotive voltage of said secondary battery based on a charge/discharge voltage of said secondary battery, a polarized voltage of said secondary battery, and a voltage drop caused by an internal resistance of said secondary battery.

13. A remaining-amount estimation device for a chargeable secondary battery, comprising:

a first estimation unit calculating a first estimation value for a remaining amount of said secondary battery based on a charging/discharging amount of said secondary battery from a time of a last remaining-amount estimation;

a second estimation unit calculating a second estimation value for the remaining amount of said secondary battery based on a state value of said secondary battery; and a correction unit correcting said first estimation value based on a correction value in accordance with a deviation of a last calculated value of the remaining amount from said second estimation value, the last calculated value of the remaining amount being a remaining-amount estimation value of said secondary battery estimated at the time of the last remaining-amount estimation, and generating the remaining-amount estimation value of said secondary battery, said correction unit calculating said correction value based on a relationship between an input/output current of said secondary battery for charging and discharging said secondary battery and said second estimation value.

14. The remaining-amount estimation device for the secondary battery according to claim 13, wherein said correction unit includes a deviation calculation unit calculating said deviation receiving said second estimation value and said last calculated value of the remaining amount, a correction value calculation unit calculating the correction value by multiplying said deviation received from said deviation calculation unit by at least one correction gain, and an estimation value calculation unit adding said correction value received from said correction value calculation unit to said first estimation value received from said first estimation unit, for output, said at least one correction gain including a first correction gain, and said correction value calculation unit including a first correction gain selection unit selecting said first correction gain based on the relationship between the input/output current of said secondary battery and said second estimation value.

15. The remaining-amount estimation device for the secondary battery according to claim 14, wherein said first correction gain selection unit, in a case where said second estimation value is not less than a first predetermined value in proximity to excessive charging of said secondary battery, increases said first correction gain as the input current to said secondary battery increases; and, in a case where said second estimation value is not more than a second predetermined value in proximity to excessive discharging of said secondary battery, increases said first correction gain as the output current from said secondary battery increases.

16. The remaining-amount estimation device for the secondary battery according to claim 14, wherein said first correction gain selection unit selects said first correction gain by referring to a predetermined map in which the input/output current of said secondary battery and said second estimation value each are defined as an input.

17. A remaining-amount estimation method for a chargeable secondary battery, comprising the steps of:

calculating a first estimation value for a remaining amount of said secondary battery based on a charging/discharging amount of said secondary battery from a time of a last remaining-amount estimation;

calculating a second estimation value for the remaining amount of said secondary battery based on a state value of said secondary battery; and correcting said first estimation value based on a correction value in accordance with a deviation of a last calculated value of the remaining amount from said second estimation value, the last calculated value of the remaining amount being a remaining-amount estimation value of said secondary battery estimated at the time of the last remaining-amount estimation, and generating the remaining-amount estimation value of said secondary battery, in the generation of the remaining-amount estimation value of said secondary battery, said correction value being calculated based on a magnitude of said last calculated value of the remaining amount and a magnitude relationship between said last calculated value of the remaining amount and said second estimation value.

18. A remaining-amount estimation method for a chargeable secondary battery, comprising the steps of:

calculating a first estimation value for a remaining amount of said secondary battery based on a charging/discharging amount of said secondary battery from a time of a last remaining-amount estimation;

calculating a second estimation value for the remaining amount of said secondary battery based on a state value of said secondary battery; and correcting said first estimation value based on a correction value in accordance with a deviation of a last calculated value of the remaining amount from said second estimation value, the last calculated value of the remaining amount being a remaining-amount estimation value of said secondary battery estimated at the time of the last remaining-amount estimation, and generating the remaining-amount estimation value of said secondary battery, in the generation of the remaining-amount estimation value of said secondary battery, said correction value being calculated based on a relationship between an input/output current of said secondary battery for charging and discharging said secondary battery and said second estimation value.

* * * * *